United States Patent [19]

van Velthoven

[11] 4,375,086

[45] Feb. 22, 1983

[54] VOLATILE/NON-VOLATILE DYNAMIC RAM SYSTEM

[75] Inventor: Armand J. van Velthoven, Manitou Springs, Colo.

[73] Assignee: NCR Corporation, Dayton, Ohio

[21] Appl. No.: 150,275

[22] Filed: May 15, 1980

[51] Int. Cl.$^3$ .............................................. G11C 11/24
[52] U.S. Cl. .................................... 365/149; 365/228
[58] Field of Search ................ 365/185, 184, 149, 228

[56] References Cited

U.S. PATENT DOCUMENTS

| | | |
|---|---|---|
| 3,761,901 | 9/1973 | Aneshansley . |
| 3,771,148 | 11/1973 | Aneshansley . |
| 3,774,177 | 11/1973 | Schaffer . |
| 3,911,464 | 10/1975 | Chang et al. ........................ 365/149 |
| 4,091,460 | 5/1978 | Schuermeyer et al. . |
| 4,175,291 | 11/1979 | Spence ................................ 365/184 |

Primary Examiner—James W. Moffitt
Attorney, Agent, or Firm—J. T. Cavender; Philip A. Dalton

[57] ABSTRACT

A volatile/non-volatile dynamic RAM cell and system in which the cell comprises a storage capacitor for volatilely storing binary information during normal RAM operation; an alterable-threshold storage capacitor for non-volatilely storing the information in non-volatile fashion during power off conditions; and an energy barrier between the two capacitors. Information can be restored to the volatile capacitor either by CCD charge transfer or by charge-pumped operation. The energy barrier facilitates efficient charge pumped restore of information. In one embodiment, the energy barrier is a high concentration substrate surface region having the same conductivity type as the substrate. Alternatively, the alterable-threshold non-volatile capacitor and the energy barrier are provided by a split-gate capacitor which has an alterable threshold non-volatile section (the non-volatile capacitor) and a non-alterable threshold section (the energy barrier).

10 Claims, 8 Drawing Figures

VOLATILE/NON-VOLATILE DYNAMIC RAM SYSTEM

BACKGROUND OF THE INVENTION

This invention relates generally to semiconductor memory devices and, more specifically, to dynamic random access memory systems having both volatile and non-volatile binary data storage capability.

Semiconductor memories generally fall into three categories: serial access memories (SAMs), read only memories (ROMs), and random access memories (RAMs).

Semiconductor SAM memories are classified as charge-coupled device memories (CCDM) or bubble domain memories (BDM). CCDM and BDM systems typically involve single or multiple serial data loops with access to data stored at any particular location typically requiring serial shifting of each bit of data to a location where it can be accessed for reading or writing. The relatively long time required for accessing data precludes the use of SAMs in systems, such as RAMs, which require very rapid changing of some or all of the stored bit pattern. SAM systems are typically employed where large amounts of data need be stored but very rapid access to any particular data bit is not required.

ROMs are so designated because they are employed usually where a fixed bit pattern is required, such as for a firmware or microcode program in a data processing system. However, within the general ROM category, there exists programmable read only memories (PROMs), eraseable PROMs (EPROMs), and electrically-alterable read-only memories (EAROMs) which are sometimes designated electrically eraseable PROMs (EEPROMs). PROMs can be written one at a time only to a selected bit pattern which is permanent. EPROMs can be electrically programmed to a preselected bit pattern but typically require that ultraviolet light be shined on the device to erase the stored bit pattern. This usually requires the EPROM device to be removed from the circuit in which it is used. EEPROMS can be electrically erased and reprogrammed in the circuit environment in which they are being used. While both EPROMs and EEPROMs have the capability of altering the bit pattern stored therein, the time required for erasing and reprogramming precludes their use as random-access memory devices in memory systems which require very rapid changing of some or all of the stored bit pattern.

Semiconductor RAM systems generally fall into two categories: static RAM systems and dynamic RAM systems. Static RAM systems typically employ bistable multivibrator or flip-flop circuits in which the stored bit value is determined by the two bistable states available to the circuit. Since static RAMs employ bistable devices, the bit content of each cell is retained without refreshing and the readout of the bit content is nondestructive. In contrast, dynamic RAMs typically employ a cell arrangement in which the stored bit value is determined by the presence or absence of a voltage stored on a semiconductor capacitor structure. Dynamic RAMs typically require periodic refreshing of the information stored on the capacitor, although the readout may be either destructive or non-destructive depending upon the cell design. As a general rule, static RAM systems are favored for smaller memory systems, whereas dynamic RAMs provide lower cost per bit for, and are thus favored for larger memory systems of perhaps 32 kilobits or larger.

All version of ROMs, including EPROMs and EEPROMs, are inherently nonvolatile, that is, do not lose the bit content of the memory if electric power to the ROM is removed or lost. This inherent nonvolatility is due either to the ROM cell design or to the electrical characteristics of the devices employed in each ROM cell. RAMs on the other hand, are generally volatile devices, i.e., the bit content of the memory is lost if electric power is removed or lost.

Referring to FIGS. 1 and 2, there are shown cross-sections of conventional MOS dynamic, volatile RAM cells 10 and 20. RAM cell 20 is similar to and operates identically to cell 10, but has a two-level polysilicon gate 24 instead of the single level gate 14 of cell 10. The dual level gate 24 eliminates the diffusion 9 required in cell 10 and therefore permits size reduction and a corresponding increase in density in cell 20. During the operation of either cell, the voltage $V_{n+}$ applied to the bit line diffusion 8 controls the availability of charge. Capacitors 12 (FIG. 1) and 22 (FIG. 2) are written to a "0" or "1" (charged or uncharged) state by driving $V_n$ high to enable charge transfer gates 13 and 23 to transfer any charge from diffusion 8 to the capacitor. During a read operation, the transfer gates are again turned on to transfer the charge from the capacitor to a sense amplifier (not shown) connected to the diffusion line 8.

As mentioned, RAM cells 10 and 20 are dynamic and volatile, that is, they require periodic refreshing of the information stored on the capacitors 12 and 22, and lose the stored information if electric power is removed or lost. Over the last decade or so, various approaches have been taken to add backup nonvolatile storage capability to dynamic RAMs. In general, the nonvolatile backup data storage capability can be provided by adding nonvolatile alterable threshold capacitor or transistor devices to the RAM cell. These cells will be referred to as volatile/nonvolatile dynamic RAM cells or simply V/NV RAM cells.

Exemplary V/NV dynamic RAM cells are disclosed in U.S. Pat. No. 3,771,148 to Aneshansley, U.S. Pat. No. 3,761,901 to Aneshansley and U.S. Pat. No. 3,774,177 to Schaffer, all of which are assigned to Applicant's assignee. Aneshansley '148 discloses a V/NV cell comprising a volatile capacitor and an NV transistor. The capacitor is accessed via the transistor, which is also used for NV storage during power down conditions. The Aneshansley '901 and Schaffer '177 patents disclose three-gate cells which store information in a nonvolatile gate during power-off conditions and also use the NV gate during normal volatile operation. Also, U.S. Pat. No. 4,175,291 to Spence, assigned to Applicant's assignee, discloses a four gate V/NV dynamic RAM cell which comprises a volatile storage capacitor, an adjacent, alterable threshold, non-volatile storage capacitor, and two charge transfer gates which are located one each on opposite sides of the capacitors. One transfer gate and the volatile capacitor are activated for volatile operation; both capacitors are used to effect charge transfer for V/NV store; and both transfer gates and both capacitors are used to effect NV/V restore, also by charge transfer.

Charge pumping has been applied to RAM cells, as discussed below, to enhance operation but, to Applicant's knowledge, not to V/NV RAM cells.

FIGS. 9 and 10 of U.S. Pat. No. 3,911,464 issued Oct. 7, 1975 to Chang et al., disclose an NV RAM cell which comprises a bit line diffusion and an adjacent split gate capacitor. The split gate capacitor comprises both alterable threshold and fixed threshold sections or capacitors. The alterable threshold capacitor is interposed between the bit line diffusion and the alterable threshold capacitor. The fixed threshold capacitor may be MOS (FIG. 9) or MNOS (FIG. 10).

The cell uses a charge-pumped read operation. As mentioned, the split gate capacitor comprises a fixed threshold capacitor which is interposed between the alterable threshold capacitor and the bit line diffusion. The binary state of the split gate capacitor is read by applying an alternating charge-pumping voltage to the capacitor gate to remove charge from the diffusion. For the exemplary n-channel device, charge is removed to the alterable threshold capacitor during the positive-going portion of the charge-pumping cycle, and dissipated from the alterable threshold capacitor into the substrate during the negative-going portion. The fixed threshold capacitor provides a potential barrier which blocks the alterable threshold capacitor from the bit line during the negative-going excursion of the charge-pumping voltage cycle and thereby prevents the return of charge to the bit line.

The cells treated in the '464 patent appear to be of advantageously small size. However, the cell structure and operation are entirely non-volatile, with the attendant well-known disadvantages. For example, the operating speed of such non-volatile devices is relatively slow, and, repeated writing and erasing of the non-volatile capacitor during normal operation tends to degrade the window between the binary threshold states.

The so-called NOVCID cell of the Chang et al. '464 patent is also used in the static NVRAM cell which is the subject of U.S. Pat. No. 4,091,460 to Schuermeyer et al. As is typical of static RAM cells, the Schuermeyer et al. '460 cell has two (hereafter left and right) inverter sections each of which comprises a reference node between a load device and a switching transistor. The switching transistor of each section is cross-coupled to the node of the opposite direction.

The Schuermeyer et al. '460 cell uses NOVCID loads and features V/NV charge transfer store and NV/V charge-pumped restore. The V/NV store and NV/V restore operations are as follows. Assume at the commencement of store that the cell is in a 0 state in which the right and left side nodes are high and low respectively, with the right and left side switching transistors off and on, respectively. During V/NV store, a large write voltage is applied to the gate of both lead transistors. Charge transfer from the conducting left side switching transistor writes the associated left side load to a high threshold state, while the right side load remains in the low threshold erased state. To effect an NV/V restore, an alternating charge pump signal is applied to the load gates. The charge-pumping current of the low threshold right side load exceeds that of the high threshold left side load, causing the associated right side node to reach the turn-on voltage of its coupled left side switching transistor before the left side node can turn on the right side transistor. Turn-on of the left side transistor returns the cell to the binary 0 state with the right and left side nodes, respectively, high and low.

Thus, charge pumping has been used to facilitate read/restore operations of strictly NV cells (Chang et al. '464) and static V/NV cells (Schuermeyer et al. '460). However, as mentioned, it is believed charge pumping has not been applied to dynamic V/NV RAM cells.

SUMMARY OF THE INVENTION

It is an object of this invention to provide a V/NV dynamic RAM cell having a minimum number of gates consistent with efficient operation.

It is also an object of this invention to provide a V/NV dynamic RAM cell which has the versatility of both charge-coupled (CCD) charge transfer and charge pumping modes of restore operation.

These and other objects are provided in a volatile/non-volatile dynamic random access memory cell comprising a volatile capacitor for volatilely storing binary information in the form of a charge/no charge condition, means for selectively supplying charge to the cell, a non-volatile storage capacitor for selectively and non-volatilely storing the binary state-representing charge, and means for applying an energy barrier between the volatile capacitor and the nonvolatile capacitor for ensuring efficient charge transfer. In a preferred embodiment, the energy barrier and nonvolatile capacitor are provided by a split gate capacitor: the energy barrier is provided by a non-alterable threshold section of the split gate capacitor and non-volatile storage is provided by an alterable threshold section. The energy barrier provides for efficient binary charge information transfer in a charge pumped mode restore operation. Both charge pumped and CCD charge transfer modes can be used to restore information to the volatile portion of the cell.

DETAILED DESCRIPTION OF THE PREFERRED EMBODIMENT

Figure 3:
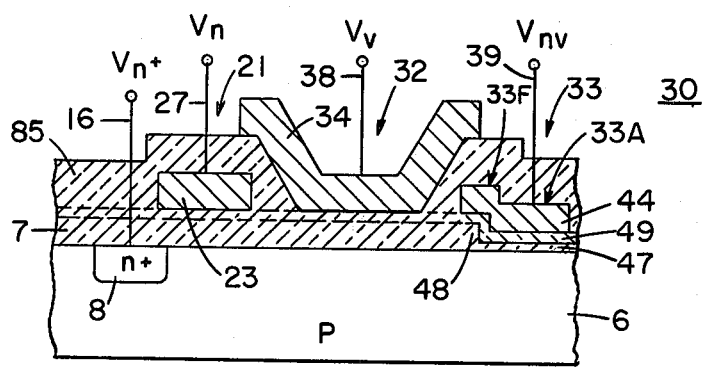
FIG. 3 is a simplified cross-sectional representation of a volatile/nonvolatile random access memory cell embodying the principles of the present invention.

FIG. 3 is a cross-sectional schematic of an n-channel (V/NV dynamic RAM cell 30 which embodies the principles of the present invention. Illustratively, the cell 30 is formed in a p-type silicon semiconductor substrate 6 and includes charge transfer device 21, volatile storage capacitor 32, and split gate, energy barrier/NV storage capacitor 33. Devices 21 and 32 have conductive gate electrodes 23 and 34, respectively, formed on a gate dielectric 7, such as silicon dioxide, of suitable thickness. N-type bit line 8 is formed in the substrate 6 laterally adjacent the transfer device 21 and on the side opposite the volatile capacitor 32. Bit line 8 is used for effecting the charged/no charge condition of this capacitor.

Split gate capacitor 33 has an NV alterable threshold-voltage section 33A and a non-alterable (fixed) threshold-voltage (NA) section 33F. Illustratively, these different characteristics of the capacitor sections are provided by a dual, silicon dioxide 47,48-silicon nitride 49 gate dielectric. Preferably, the silicon dioxide 47 of the alterable NV section 33A is very thin, typically 10–60 Angstroms thick, for permitting charge transfer between the charge-storing silicon nitride-silicon dioxide interface and the substrate to thereby alter the threshold voltage. In contrast, the oxide 48 of the NA section 33F is sufficiently thick, typically about 1,000 Angstroms, to prevent charge transfer and thereby preclude alteration of the threshold during normal operation. The oxide gate dielectric 7 associated with fixed threshold devices 21 and 32 is typically 400–700 Angstroms thick. A suitable thickness for the silicon nitride layer 49 is 450–550 Angstroms in both sections 33A and 33F.

It will be appreciated by those skilled in the art that the cell 30 can be p-channel. Also, the above thickness values are examples only and can be readily varied to alter performance characteristics. The dual dielectric silicon dioxide-silicon nitride MNOS structure can be used for all the devices 21, 32 and 33, with appropriate adjustment of the thicknesses associated with the devices 21 and 32 to provide normal, non-alterable-threshold MOSFET behavior. In general, the cell of the present invention can comprise various non-volatile conductor-insulator-substrate field effect transistor structures. Examples are $CI_1I_2SFET$, where $I_1$ and $I_2$ are dielectric such as aluminum oxide and silicon oxide (MAOS), or are the aforementioned silicon nitride and silicon oxide (MNOS); or $CI_1I_2I_3SFET$, where $I_1$, $I_2$ and $I_3$ are silicon oxide (or silicon oxynitride), silicon nitride, and silicon oxide. While the invention is applicable to conventional metal gate technology, the emerging semiconductor (polycrystalline silicon or polysilicon) gate structure (e.g., SNOS or SONOS) is preferred. A SNOS structure is shown in FIG. 3 and referred to subsequently.

Figure 1:
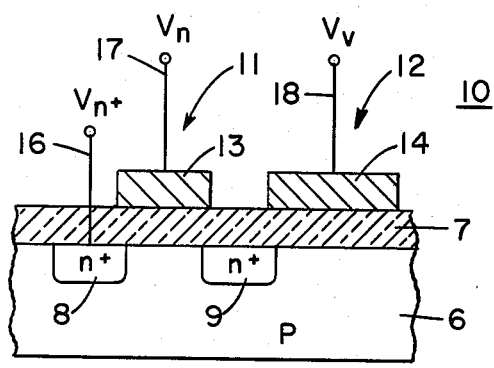
FIGS. 1 and 2 are simplified cross-sectional representations of conventional volatile random access memory cells.
Figure 2:
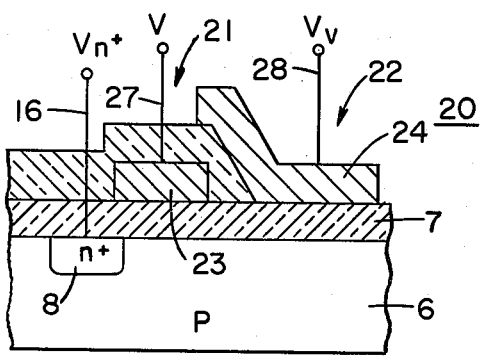

The following terminology will be used. First, device 21 is conventionally termed, and will be referred to herein as "transfer gate". However, it is understood that the term "transfer gate" encompasses a transistor such as 11 (FIG. 1). Secondly, regarding the control voltages for the cell 30, $V_n+$ refers to the voltage applied to the bit line 8 via address line 16; $V_n$ is the voltage applied to the gate electrode 23 of transfer gate 21 via address line 27; $V_v$ refers to the voltage applied to the volatile transistor gate electrode 34 via bias line 38; and $V_{nv}$ refers to the voltage applied to the gate electrode 44 of the split gate capacitor 33 via address line 39. Finally, in reference to the n-channel cell 30, unless otherwise specified, the supply voltage $V_{DD}$ is 12v., $V_n$ and $V_n+$ are 12v. (high) or 0 volts (low), and the substrate bias voltage $V_{BB}$ is $-5v$.

VOLATILE OPERATION

During volatile operation of the cell, the voltage $V_{nv}$ is at ground, 0v., to block the split gate capacitor 33 from the volatile portion 21–32 of the cell. To volatilely write the cell 30 to the (uncharged) 1 state, the diffusion line 8, transfer gate electrode 23 and capacitor gate electrode 34 are all driven high to apply approximately the 12 volt potential of the bit line diffusion 8 to the substrate surface region of capacitor 32. Please note, as used here, reference to a "0" capacitor state refers to the presence of sufficient minority charge carriers (electrons for p-type substrate) to place the capacitor substrate surface at a low potential relative to the high potential gate electrode so that the capacitor is polarized. A "1" state implies a relative lack of charge, a high substrate surface potential, and an unpolarized capacitor. Next, the transfer gate 23 is driven low to block the capacitor 32 from the diffusion line 8. The diffusion line 8 may then be driven low.

If, instead, the volatile capacitor 32 is to be written to a (charged) 0 state, the same voltage timing sequence applies except that the diffusion line 8 is held low throughout the cycle. The substrate surface region of the capacitor 32 again approximates the potential of the bit line diffusion 8, which is 0v. in this case.

Figure 4:
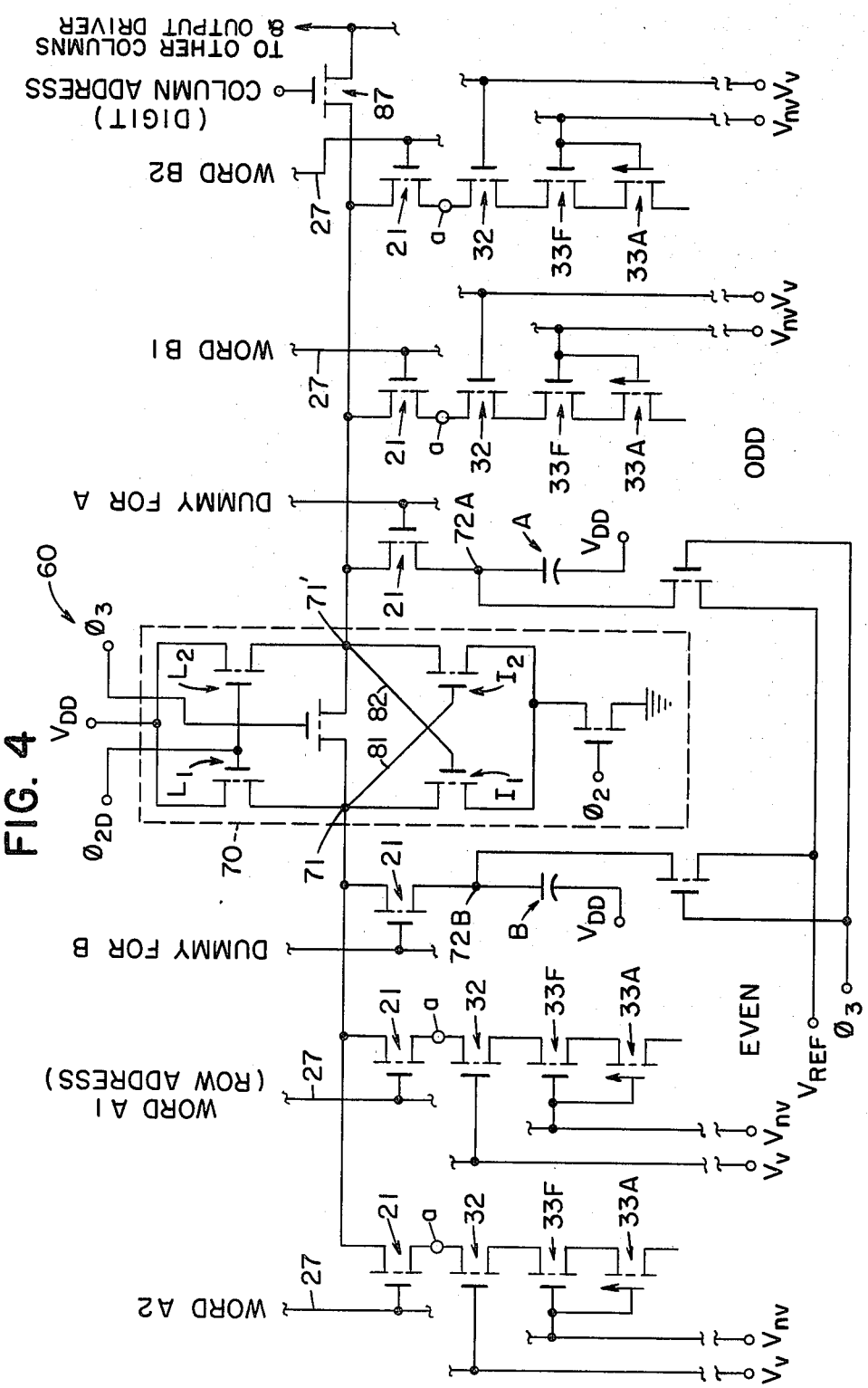
FIG. 4 is a simplified schematic of a portion of a random access memory which utilizes the cell of FIG. 3.

To further illustrate volatile operation of the RAM cell 30, consider first a read cycle for RAM array 60 shown in FIG. 4. As those skilled in the art will appreciate, memory cycles normally start with cell read-out and function to refresh the stored information. During a typical volatile read cycle, the row or word addresses are low ($V_n$ is at ground). Then, the precharge clock $\phi_3$ turns on. The load transistors $L_1$ and $L_2$ of sense amplifier 70 are of high impedance; the input transistors $I_1$ and $I_2$ are of low impedance. Thus, with clocks $\phi_2$ and $\phi_{2D}$ on, when precharge clock $\phi_3$ turns on, nodes 71 and 71' of bistable multivibrator sense amplifier 70 are equalized at ground (approximately). Precharge clock $\phi_3$ also sets the nodes 72A and 72B associated with dummy capacitors A and B to $V_{REF}$. $V_{REF}$ is between the 0 (low) and 1 (high) states, for example, at 6 volts.

Next, precharge clock $\phi_3$ and power clocks $\phi_2$ and $\phi_{2D}$ are turned off. A selected row address and the opposite side dummy (for example word $A_1$ and dummy A) are turned on by $V_n$ and information in the associated row storage capacitor 32 and the opposite side dummy capacitor A is available via $A_1$ and dummy A transfer gates 21, respectively, to amplifier nodes 71 and 71'. Power clocks $\phi_2$ and $\phi_{2D}$ are turned on again to provide amplified information at the nodes 71 and 71'. That is, if the selected volatile storage capacitor 32 is in a charged, 0 state, associated node a is low and the node 72A for the associated dummy capacitor A is higher, at about 6 volts. As a result, as the capacitances associated with cross-connect lines 81 and 82 are charged, line 82 (associated with dummy capacitor A) is charged faster than line 81 (associated with the lower potential of node a). Consequently, line 82 is charged and turns on transistor $I_1$ before $I_2$ can be turned on. $I_1$ connects node 71 to ground, thereby preventing $I_2$ from turning on, and permits node 71' to become fully charged to $V_{DD}$.

In short, in response to the low potential, 0 state on the node a of $A_1$ or any other even matrix capacitor 32, node 71 is placed at "0" and node 71' is placed at an amplified "1" state (inverted relative to node a). Similarly, if $A_1$ capacitor 32 or any of the other even matrix capacitors is initially in a "1" state, a "0" ("1") is applied to node 71' (71). Since information is normally read out from the node 71', to implement read out, the column address is used to turn on transistor 87 to access the information on node 71'.

The same type of sequence applies to the storage capacitors of the odd matrix. Thus, information in the odd matrix capacitors is applied without inversion to the adjacent node 71' and is applied in inverted form to the other node 71. For example, a "1" on node a of $B_1$ capacitor 32 results in an amplified "1" at node 71' and a 0 at node 71. Since the data typically is read out from node 71', the information from the odd matrix capacitors is in non-inverted form, while the information from the even matrix capacitors is inverted. Thus, typically the information at node 71' from the even matrix capacitors is inverted to provide non-inverted data out. Since those skilled in the art will readily implement this technique and since it is not part of the invention, the inversion technique need not be discussed further here.

After the read cycle, all clocks return to their original state, preparatory to the next operating cycle. As the row address transfer gate 21 turns off, the amplified information on node 71 (71') is isolated on the even (odd) storage capacitor 32 and the capacitor is thereby "refreshed" to its original state.

In a refresh only cycle (no read), it is not necessary to turn on column address transistor 87 to access node 71'. Instead, the amplified information available on nodes 71 or 71' is returned to the corresponding even or odd matrix storage cell, and is isolated in the cell as the associated row address transistor 32 turns off.

one can be increased or decreased, respectively, by decreasing or increasing the other.

STORE

Figure 5:
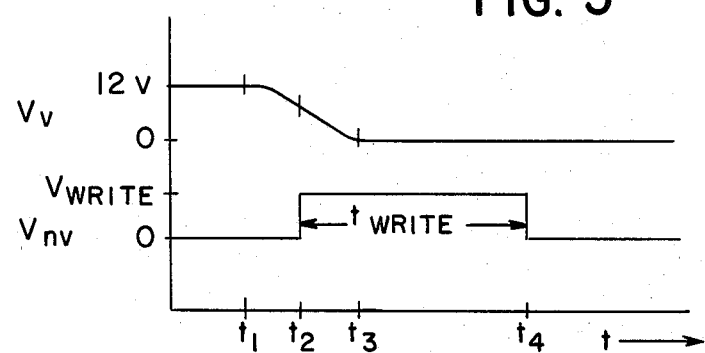
FIG. 5 is a timing diagram of a nonvolatile store operation for the memory cell of FIG. 3.

Upon power down, and prior to the loss of the biasing voltage on the volatile storage capacitor 32, the split gate capacitor 33 is turned on to receive the charge associated with the volatile storage capacitor 32. That is, and referring to FIGS. 3 and 5, at store time $t_2$ (which is just after the onset of power down at $t_1$ and prior to $V_n$ on the volatile capacitor 32 going to ground at $t_3$), $V_{nv}$ is driven to a large positive write voltage, $V_{WRITE}$. With the split gate high and the volatile capacitor gate 34 going low, any charge associated with the volatile capacitor is transferred to the substrate of the AT/NV capacitor section 33A.

If the volatile capacitor 32 was in the charged, 0 state at the onset of power down, charges are transferred to the relatively deep potential well beneath the AT/NV section 33A of the split capacitor 33. This produces a high electrical field in the gate dielectric and shifts the threshold voltage of the AT/NV section 33A to the more positive, VT1 state. See TABLE 1, state No. 3.

TABLE I
SEQUENCE OF CAPACITOR STATES

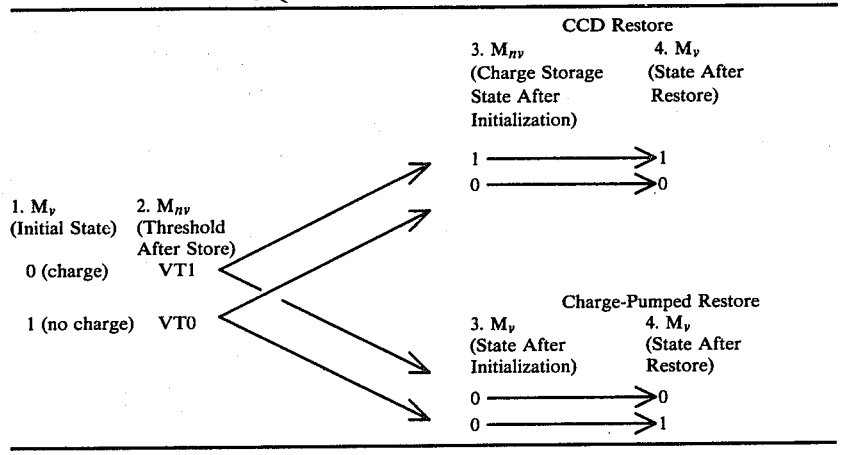

ERASE OF NONVOLATILE CAPACITORS

Preparatory to storing information from the volatile storage capacitors 32, the alterable threshold voltage, non-volatile (AT/NV) capacitor sections 33A are erased to a low threshold, "0" state (VT0). Since the NV sections may be erased during normal RAM operation without destroying the data in the volatile RAM capacitors 32, erasing can be done either during normal RAM operation or immediately upon power down, prior to writing the volatile capacitor data into the nonvolatile capacitor section. Hereafter, to facilitate description, reference will be made simply to erasing/writing split gate capacitor 33 with the understanding that this reference is to the AT/NV section 33A of the capacitor.

The n-channel split gate capacitors 33 are erased by applying a large negative voltage to the gate 44. Preferably the erase voltage is near the breakdown voltage of the silicon nitride-silicon dioxide gate insulator. The erase voltage is applied for a predetermined time sufficient to move the threshold voltage of the non-volatile capacitors in the negative direction to VT0. It will be appreciated by those skilled in the art that the erase times and erase voltages are interdependent, i.e., that Conventional theory is that the charges tunnel into the gate dielectric 47–49 and are stored there, primarily at the silicon nitride-silicon dioxide interface.

If the volatile capacitor 32 was in the uncharged 1 state, there are insufficient charge carriers to shift the threshold voltage of the AT/NV section 33A and the capacitor 33 remains in the erased, VT0 threshold state. See Table I, state No. 3.

Those skilled in the art will understand that the applied voltage $V_{nv}=V_{WRITE}$ must be sufficient to fully write the individual cells 30 before all cells are charged by thermally-generated recombination of electron-hole pairs. That is, the completion of $t_{WRITE}$ at $t_4$ must occur within a few milliseconds. For the exemplary parameters for cell 30, $V_{WRITE}=20v$. completes the writing in about one millisecond, as discussed below.

It is desired to have complete transfer of charge from volatile capacitor 32 to non-volatile capacitor 33 to write the non-volatile capacitor strongly and thereby facilitate the sense amplifier 70 distinguishing between VT0 and VT1. It is thus necessary that non-volatile capacitor 33 have sufficiently high capacitance to store essentially all the charge available from the volatile capacitor 32. This charge storage requirement is in conflict with the aim of minimizing surface area of the non-volatile capacitor to maximize device cell density.

These conflicting performance and density requirements are both optimized by using an AT/NV capacitor section 33A which has a surface area that is just large enough to set the charge of section 33A appoximately equal to the charge of the volatile storage capacitor 32.

A charge on the volatile capacitor $Q_v = V_v \times C_v$ is available for transfer to the nonvolatile capacitor. For charge equality and complete transfer the following condition, expressed in terms of capacitance, must be met:

$$Q_v = V_v \times C_v = Q_{nv} = V_{nv} \times C_{nv} \quad (1)$$

In terms of the respective capacitance per unit area, $C'$, and capacitor surface area, A, capacitance is given by $C = C'A$ and equation (1) becomes:

$$V_{nv}(C'_{nv} \times A_{nv}) = V_v(C'_v \times A_v). \quad (2)$$

The capacitance per unit area, $C'_{nv}$, provided by the thin, oxide-nitride dielectric of the AT/NV capacitor 33A is nearly three times that, $C'_v$, of the thick oxide dielectric of the volatile capacitor 32. Also, the write voltage ($V_{WRITE} = 20$ v.) on capacitor 33 is approximately twice the voltage ($V_v = 12$ v.) applied to the volatile capacitor 32. Thus, typically $$V_{nv} = V_{WRITE} = 2V_v, \quad (3)$$

and $$C_{nv} = 3C_v. \quad (4)$$

Substituting (3) and (4) into (2) gives:

$$2V_v \times 3C'_v \times A_{nv} = V_v \times C'_v \times A_v, \text{ or } A_{nv} = A_v/6. \quad (5)$$

Thus, the charge associated with capacitors 32 and 33 is equal (for the given dielectrics and thicknesses and conditions of relative capacitance per unit area and relative write voltages) when the surface area of the nonvolatile capacitor section 33A is about one-sixth the surface area of the volatile capacitor.

For the exemplary silicon substrate and gate dielectric, and a surface area of about 90 square micrometers and 15 square micrometers for the volatile and nonvolatile capacitors, respectively, $V_{WRITE}$ of about 20 volts will complete charge transfer and shift the threshold voltage of the AT/NV capacitor section 33A about 5 volts in $t_{WRITE} = 1$ millisecond.

RESTORE

1. CCD Mode

Figure 6:
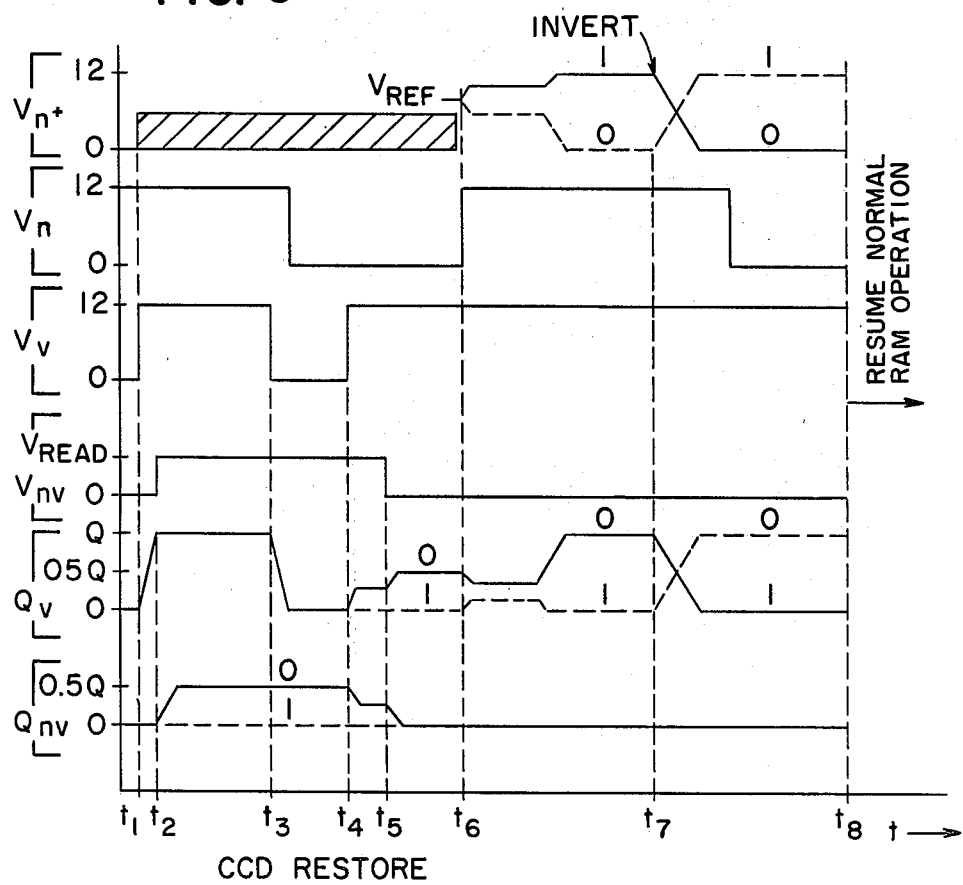
FIG. 6 is a simplified timing diagram of a CCD mode restore operation for the random access memory cell of FIG. 3.

The CCD mode for restoring data to the volatile capacitor 32 is summarized in FIG. 6. Referring also to FIG. 3, the cell 30 is first initialized by transferring negative charge to the non-volatile capacitor 33. This is done at restore time $t_1$ by taking $V_{n+}$ to ground to make charge available at the bit line diffusion 8 and by driving gate $V_v$ high, with $V_n$ high, to transfer charge to the volatile capacitor 32. At restore $t_2$, the gate 44 of capacitor 33 is taken to a voltage $V_{nv} = V_{READ}$ which is between the two threshold voltages, VT1 and VT0, of the AT/NV section 33A. If the threshold is VT0, a portion of the charge, $Q_V$, associated with the volatile capacitor 32 will be transported to the AT/NV section 33A of capacitor 33. If the threshold is VT1 (written) no depletion layer is induced in the AT/NV capacitor section 33A and no charge is stored therein.

Then, commencing at restore $t_3$, $V_v$ and $V_n$ are driven low to isolate the charge on the AT/NV capacitor 33A. See the FIG. 6 diagram for AT/NV charge $Q_{NV}$. See also TABLE 1, state No. 3.

Now the data is restored to the volatile capacitor 32. At restore $t_4$, $V_v$ is again driven high and, at $t_5$, $V_{nv}$ is driven low to transfer any charge stored in AT/NV section 33A to the volatile capacitor 32. (It does not matter what state $V_{n+}$ is in, because the bit line 8 is isolated.) Since $V_{READ}$ on the capacitor 33 is only a portion of $V_{WRITE}$ (for example, 0.5 $V_{WRITE}$) only that corresponding portion of the initial volatile capacitor charge $Q_V$ (for the example, about 0.5Q) is stored on the non-volatile capacitor 33 and returned to the volatile capacitor 32.

Thus, during the interval $t_4$-$t_6$, the initial 0 or 1 state of the volatile capacitor 32 is partially restored, inverted, as 1 or 0.

Next, at $t_6$, the sense amplifier 70 completes the restore of the capacitor to the full 0 or 1 state. For this purpose, and referring also to FIG. 4, $V_{REF}$ is set to a value which is between the relatively high and relatively low voltages on capacitor 32 node a associated with the partially restored capacitor 1 and 0 states, respectively. Typically, $V_{REF}$ is approximately 6 volts. If, as an example, at $t_6$ row A1 capacitor 32 has been restored inverted to the relatively uncharged, high potential 1 state, the voltage at node a associated with A1 capacitor 32 is greater than the $V_{REF}$ on node 72A. The charge $Q_V$ on volatile capacitor 32 and the substrate surface potential relative to $V_{REF}$ are both shown in FIG. 6. Referring to FIG. 4, the higher voltage on node 71 turns on $I_2$, clamping node 71' to ground and allowing $V_{DD} = 12$ volts to restore node 71 and A1 capacitor 32 fully to the 1 state.

Conversely, if A1 capacitor 32 has been "restored" to a partially charged, low potential 0 state at $t_6$, $V_{REF}$ on dummy A node 72A is greater than the voltage on A1 capacitor 32 node a. The relatively high voltage on node 71' turns on transistor $I_1$, clamping node 71 to ground and completing the restore of A1 capacitor 32 to the fully charged 0 state. In short, during the period between $t_6$ and $t_7$, sense amplifier 70 completes the full inverted restore of the 0 to 1 state.

At $t_7$ the inversion capability of conventional state-of-the-art RAM systems is used to perform bit inversion. Typically, data can be inverted at the rate of one clock time per bit or approximately 150 nanoseconds. Thus, and referring also to TABLE I, the volatile 0 or 1 data in capacitor 32 at power down is restored in non-inverted fashion at $t_8$ and normal volatile RAM operation can commence. As mentioned previously, the non-volatile capacitor 33 can be erased during normal RAM operation or immediately upon the next power down situation.

2. Charge-Pumped Mode

Figure 7:
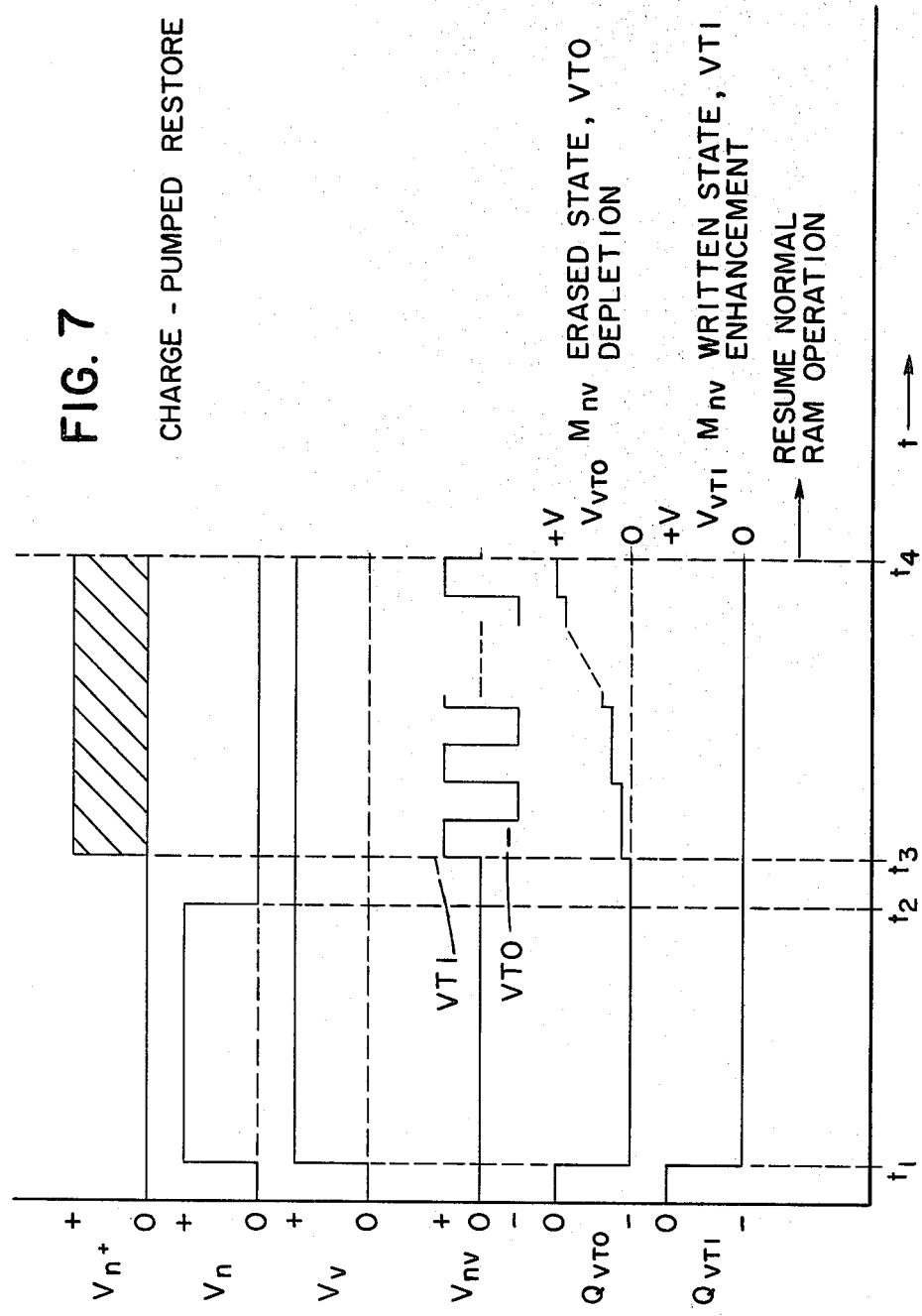
FIG. 7 is a simplified timing diagram of a charge pumping mode restore operation for the cell of FIG. 3.

An alternative, charge-pumped mode for restoring data to the volatile capacitor is shown in FIG. 7. At $t_1$, the volatile capacitor 32 is initialized to 0 using $V_{n+} = 0$v. and $V_n = V_v = 12$v., to turn on word address transistor 21 and the volatile capacitor 32 to apply charge from the bit line diffusion 8 to the capacitor 32.

At $t_2$, when the volatile capacitor 32 has become charged, $V_n$ is taken low to isolate the charge on the volatile capacitor.

At restore $t_3$, charge pumping is initiated on non-volatile capacitor 33. $V_{nv}$ is alternately switched positive, not exceeding the written threshold VT1, and negatively to below the erased threshold VT0. If the AT/NV capacitor 33A is at VT0 (i.e., was written to VT0 at power down as the result of the "1" state of capacitor 32), a relatively deep potential well is formed beneath the non-volatile capacitor 33 during the positive swing of each pumping cycle. As the result of this deep potential well, a portion of the charge associated with the initialized volatile capacitor 32 is transferred to the non-volatile capacitor 33. This charge re-distribution takes place according to $Q_V = C_1 V_1 = C_2 V_2$, where $C_1 = C_v$ (capacitance of volatile capacitor 32) and $C_2 = C_v + C_{nv}$ (capacitance of volatile capacitor 32 and non-volatile capacitor 33), and $V_2 = C_v V_1 / C_v + C_{nv}$. During each pumping cycle when $V_{nv}$ swings negative, the charge in the non-volatile capacitor 33 is transferred into the substrate 6.

This positive-negative cycle is repeated a number of times, until nearly all charge has been removed from the volatile capacitor 32 and transferred to the substrate at $t_4$. At this time, the volatile capacitor 32 has been returned without inversion to the previous "1" state.

Typically, for the topology as described above, about ten charge pumping cycles leave the volatile capacitor 32 with about 0.10Q or 0.90Q depending upon whether the non-volatile capacitor 33 is at VT0 or VT1, respectively. State-of-the-art sense amplifiers can readily sense the resulting difference in capacitor charge.

In case the non-volatile capacitor 33 has been written to a relatively high threshold VT1 at power down by a (charged) 0 state AT/NV capacitor 33A state, the AT/NV capacitor doesn't invert during the positive voltage swing of the pumping cycle and the shallow potential well associated therewith precludes significant charge transfer. (Furthermore, when $V_{nv}$ is switched negative, the tendency is for any minority carriers associated with the non-volatile capacitor 33 to transfer to the relatively deeper potential well associated with the volatile capacitor 32). As a result, after the charge pumping cycle, the volatile capacitor retains its initialized 0 state. In effect, volatile capacitor 32 has been returned without inversion to its original pre-power down "0" state.

Figure 8:
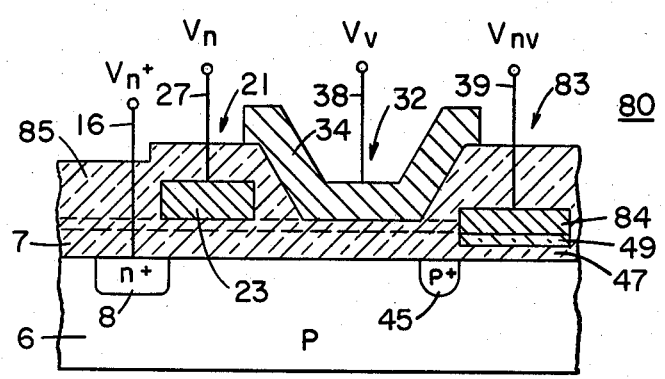
FIG. 8 is an alternative embodiment of the cell of FIG. 3.

For efficient charge-pumped restore, a potential barrier is inserted between the volatile capacitor 32 and the non-volatile capacitor 33 so that when the non-volatile capacitor is in the VT1 state, change will not be returned to the volatile capacitor during the negative swing of the charge pumping cycle. This can be accomplished by (1) a diffused or implanted barrier 45 (FIG. 8) which is a high concentration surface region of the same conductivity type as the substrate, or (2) by the non-memory section 33F of the split gate capacitor 33 (FIG. 3). Surface barrier regions are disclosed, e.g., in U.S. Pat. No. 4,115,794 issued Sept. 19, 1978 to DeLaMoneda, while a barrier comprising a fixed threshold section of a split gate capacitor is described in the Chang et al. '464 patent.

As used herein, both of the above types of barriers provide an increased inversion threshold in the underlying substrate region such that the region inverts along with the AT/NV capacitor 33A substrate surface region during the positive swing of the charge pumping cycle to allow unimpeded transfer of charge from the volatile capacitor 32 to the capacitor 33A, but provides a potential energy barrier which prevents return of electrons to the volatile capacitor during the negative swing of the charge-pumping cycle. The barrier thereby improves the efficiency of charge-pumping. The barrier surface area should be small compared to the surface area of the volatile capacitor 32 to prevent excessive charge losses during pumping. Because even very small barriers are effective, the practical limits on dimensions are dictated by the photolithographic resolution of minimum feature size.

At this point, the data which existed in the volatile capacitor 32 at power down has been restored without inversion. Normal operation can be resumed. The non-volatile capacitor array can be erased at any time during normal volatile RAM operation or immediately upon power down in preparation for the next store cycle.

Thus, there has been described a V/NV RAM cell which utilizes only three gates, uses only slightly more area than a volatile RAM cell, and is a straightforward substitution for conventional volatile RAM cells in memory arrays with virtually no additional circuitry required.

Having described a preferred embodiment of the cell and its working environment, what is claimed is:

1. A volatile/non-volatile RAM cell having volatile data store, volatile-to-nonvolatile store, and non-volatile-to-volatile restore capabilities, comprising:
    volatile storage means, including a capacitor, for storing binary charge data;
    non-volatile storage means for selectively storing the charge data in the volatile storage means;
    means for providing a preselected energy barrier which must be overcome for charge transfer between the volatile storage means and the non-volatile storage means; and
    a charge transfer device for effecting the charge storage state of the volatile storage means during volatile operation and in cooperation with the nonvolatile storage means effecting the nonvolatile-to-volatile restore operation.

2. The volatile/non-volatile RAM cell of claim 1 wherein the non-volatile storage means and the barrier means comprise, respectively, a non-volatile alterable-threshold section and a non-alterable threshold section of a split gate capacitor.

3. The volatile/non-volatile RAM cell of claim 2 wherein the split gate capacitor is MNOS or SNOS.

4. A volatile/non-volatile dynamic field-effect RAM cell having volatile data store, volatile-to-nonvolatile store, and nonvolatile-to-volatile restore capabilities, comprising:
    a semiconductor substrate of a first conductivity type;
    a capacitor formed in said substrate for storing binary information in the form of charge volatilely stored therein;
    means for selectively supplying charge to said volatile capacitor;
    a nonvolatile capacitor formed in said substrate operable for selectively receiving, storing and restoring to the volatile capacitor the binary charge information;
    energy barrier means in said substrate interposed between said volatile capacitor and said nonvolatile capacitor, said energy barrier means providing a predetermined energy barrier to charge transfer from said nonvolatile capacitor to said volatile capacitor; and wherein said means for supplying charge includes a charge transfer device for effecting the charge storage state of the volatile storage capacitor during volatile operation and cooperating with the nonvolatile capacitor to effect the nonvolatile-to-volatile restore operation.

5. The volatile/nonvolatile dynamic field-effect RAM cell of claim 4, said energy barrier means comprising a substrate impurity region of the first conductivity type.

6. The volatile/nonvolatile dynamic field-effect RAM cell of claim 4, said energy barrier means and said nonvolatile capacitor comprising a split-gate capacitor of the type $CI_1I_2S$, wherein C is a gate electrode, $I_1$ is a dielectric such as silicon nitride, $I_2$ is a dielectric such as silicon dioxide, and S is said semiconductor substrate;

said energy barrier means comprising a non-alterable threshold section of said split gate capacitor; and said nonvolatile capacitor comprising an alterable threshold, nonvolatile section of said split gate capacitor.

7. In a volatile/nonvolatile dynamic field-effect RAM cell comprising a semiconductor substrate, a capacitor formed in the substrate for volatilely storing binary charge information, means for selectively supplying charge to the volatile capacitor, and nonvolatile capacitive charge storage means, the improvement comprising structure suitable for effecting charge pumped restore or charge transfer restore to the volatile capacitor of information stored in said nonvolatile charge storage means, characterized by said nonvolatile charge storage means comprising a split gate capacitor having an alterable threshold, nonvolatile section and a non-alterable threshold section interposed between said nonvolatile section and said volatile capacitor, said non-alterable capacitor section providing a substrate surface potential barrier for preventing charge leakage from said volatile capacitor to said non-volatile section during the charge pumped restore operation.

8. The volatile/nonvolatile RAM cell of claim 7 wherein said split gate capacitor is selected from one of $CI_1I_2S$ and $CI_1I_2I_3S$, wherein C is a conductive gate electrode; $I_1$, $I_2$ and $I_1$, $I_2$, $I_3$ are multiple layer gate insulators; and S is said semiconductor substrate.

9. A volatile/non-volatile dynamic random access memory system having volatile store, volatile-to-nonvolatile store, and nonvolatile-to-volatile restore capabilities, comprising:

a plurality of volatile/non-volatile dynamic field effect memory cells formed in a substrate;

each cell comprising a capacitor formed in the substrate for volatilely storing binary charge information; non-volatile capacitive charge storage means suitable for effecting charge-pumped restore or charge transfer restore to the volatile capacitor of information stored in said non-volatile charge storage means; a transfer gate for controlling the application of binary charge information to the volatile capacitor for volatile storage and to the non-volatile storage means to initiate nonvolatile-to-volatile restore to the volatile capacitor;

said non-volatile storage means comprising a split gate capacitor section having an alterable threshold, non-volatile section and a non-alterable threshold capacitor section interposed between said non-volatile section and said volatile capacitor; said non-alterable capacitor section providing a substrate surface potential barrier for preventing charge leakage from said non-volatile capacitor section to said volatile capacitor during charge-pumped restore operation;

amplifier means including an output terminal, said amplifier means being connected to said memory cells and being responsive to a voltage stored on said volatile capacitor representing the binary state of said capacitor for generating a signal representing said voltage at said output node; and means for accessing the signal information at said output node.

10. The random access memory system of claim 9, further comprising:

said amplifier means being a bistable multivibrator including a pair of nodes;

said plurality of memory cells comprising two arrays, the first array being connected to one of said nodes, and the second array being connected to the second of said nodes for controlling the binary state of said multivibrator; and said accessing means being connected to one of said nodes.

* * * * *